US008831061B2

(12) United States Patent
Lauer et al.

(10) Patent No.: US 8,831,061 B2
(45) Date of Patent: Sep. 9, 2014

(54) EDGE EMITTING SEMICONDUCTOR LASER CHIP

(75) Inventors: Christian Lauer, Regensburg (DE); Harald König, Bernhardswald (DE); Wolfgang Reill, Pentling (DE); Uwe Strauss, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 200 days.

(21) Appl. No.: 13/127,887

(22) PCT Filed: Oct. 21, 2009

(86) PCT No.: PCT/DE2009/001482
§ 371 (c)(1),
(2), (4) Date: Jun. 16, 2011

(87) PCT Pub. No.: WO2010/057455
PCT Pub. Date: May 27, 2010

(65) Prior Publication Data
US 2011/0243169 A1  Oct. 6, 2011

(30) Foreign Application Priority Data
Nov. 21, 2008  (DE) .................. 10 2008 058 436

(51) Int. Cl.
| | | |
|---|---|---|
| *H01S 5/42* | (2006.01) | |
| *H01S 5/12* | (2006.01) | |
| *H01S 5/042* | (2006.01) | |
| H01S 5/40 | (2006.01) | |
| H01S 5/22 | (2006.01) | |
| H01S 5/10 | (2006.01) | |
| H01S 5/022 | (2006.01) | |
| H01S 5/20 | (2006.01) | |
| H01S 5/065 | (2006.01) | |

(52) U.S. Cl.
CPC ............ *H01S 5/0425* (2013.01); *H01S 5/4031* (2013.01); *H01S 5/2205* (2013.01); *H01S 5/1053* (2013.01); *H01S 2301/166* (2013.01); *H01S 5/4012* (2013.01); *H01S 5/02284* (2013.01); *H01S 5/1237* (2013.01); *H01S 2301/18* (2013.01); *H01S 5/1064* (2013.01); *H01S 5/2036* (2013.01); *H01S 5/10* (2013.01); *H01S 5/0655* (2013.01); *H01S 5/1234* (2013.01); *H01S 5/1228* (2013.01); *H01S 5/1017* (2013.01)
USPC .................................. 372/45.01; 372/46.011

(58) Field of Classification Search
CPC ... H01S 5/1003; H01S 5/1017; H01S 5/1064; H01S 5/1228; H01S 5/1237; H01S 5/2205
USPC ......................................... 372/45.01, 46.011
See application file for complete search history.

(56) References Cited

U.S. PATENT DOCUMENTS

| | | | |
|---|---|---|---|
| 4,694,459 A | 9/1987 | Burnham et al. | |
| 5,272,711 A | 12/1993 | Mawst et al. | |

(Continued)

FOREIGN PATENT DOCUMENTS

| | | |
|---|---|---|
| DE | 697 30 872 T2 | 9/2005 |
| DE | 10 2008 014 092 A1 | 7/2009 |

(Continued)

OTHER PUBLICATIONS

Lindsey, C., et al. "Tailored-Gain Broad-Area Semiconductor Laser with Single-Lobed Diffraction-Limited Far-Field Pattern," Electronics Letters, Aug. 1, 1985, vol. 21, No. 16, pp. 671-673.

(Continued)

*Primary Examiner* — Julio J Maldonado
*Assistant Examiner* — Michael Carter
(74) *Attorney, Agent, or Firm* — Slater & Matsil, L.L.P.

(57) ABSTRACT

An edge emitting semiconductor laser chip includes a semiconductor body, which comprises at least one active zone in which electromagnetic radiation is generated during the operation of the semiconductor laser chip. At least one contact strip is arranged on a top surface at a top side of the semiconductor body. At least two delimiting structures are for delimiting the current spreading between the contact strip and the active zone. The delimiting structures are arranged on both sides of the contact strip.

18 Claims, 13 Drawing Sheets

(56) References Cited

U.S. PATENT DOCUMENTS

| | | | |
|---|---|---|---|
| 6,122,299 | A | 9/2000 | DeMars et al. |
| 6,757,313 | B1* | 6/2004 | Connolly et al. ........ 372/46.015 |
| 6,947,464 | B2 | 9/2005 | Schmid |
| 7,542,496 | B2* | 6/2009 | Inenaga et al. .................. 372/36 |
| 2002/0146051 | A1* | 10/2002 | Kuniyasu et al. ............... 372/46 |
| 2003/0147445 | A1 | 8/2003 | Zeitner et al. |
| 2003/0147554 | A1 | 8/2003 | Wei et al. |
| 2003/0219053 | A1* | 11/2003 | Swint et al. ...................... 372/46 |
| 2005/0249255 | A1* | 11/2005 | Dwilinski et al. ......... 372/49.01 |
| 2006/0078020 | A1* | 4/2006 | Izu et al. .................... 372/43.01 |
| 2006/0133443 | A1* | 6/2006 | Chua et al. ............... 372/50.121 |
| 2006/0193353 | A1* | 8/2006 | Kim et al. ........................ 372/19 |
| 2008/0089374 | A1 | 4/2008 | Eichler et al. |
| 2008/0144691 | A1 | 6/2008 | Hatori et al. |
| 2010/0284434 | A1 | 11/2010 | Koenig et al. |

FOREIGN PATENT DOCUMENTS

| | | |
|---|---|---|
| DE | 10 2008 014 093 A1 | 7/2009 |
| DE | 10 2008 012 859 A1 | 11/2009 |
| EP | 0 386 634 A1 | 9/1990 |
| EP | 1 012 933 B1 | 9/2004 |
| EP | 1 906 498 A1 | 4/2008 |
| GB | 2 397 692 A | 7/2004 |
| JP | 49-071884 | 7/1974 |
| JP | 50-029283 | 3/1975 |
| JP | 10-215024 A | 8/1998 |
| JP | 2002232076 A | 8/2002 |
| WO | WO 00/66614 | 11/2000 |
| WO | WO 2009/080012 A1 | 7/2009 |
| WO | WO 2009/082999 A2 | 7/2009 |

OTHER PUBLICATIONS

Lindsey, C., et al., "Fundamental Lateral Mode Osillation Gain Tailoring in Broad Area Semiconductor Lasers," Applied Physics Letters 47, Sep. 15, 1985, pp. 560-562, American Institute of Physics.

Gavrilovic, P,. et al., "CW high POWER Single-Lobed Far-Field Operation of Long-Cavity AlGaAs—GaAs Single-Quantum-Well Laser Diodes Grown by MOCVD," IEEE Journal of Quantum Electronics, vol. 27, No. 7, Jul. 1991, pp. 1859-1862, IEEE.

Tilton, M., et al., "High Power, Nearly Diffraction-Limited Output from a Semiconductor Laser with an Unstable Resonator," IEEE Journal of Quantum Electronics, vol. 27, No. 9, Sep. 1991, pp. 2098-2108, IEEE.

Kintzer, E.S., et al., "High-Power, Strained-Layer Amplifiers and Lasers with Tapered Gain Regions," IEEE Photonics Technology Letters, vol. 5, No. 6, Jun. 1993, pp. 605-608, IEEE.

Sun, Y., et al., "Thermally Controlled Lateral Beam Shift and Beam Steering in Semiconductor Lasers," IEEE Photonics Technology Letters, vol. 7, No. 1, 1995, 3 pages, IEEE.

Vawter, G.A., et al., "Semiconductor Laser with Tapered-Rib Adiabatic-Following Fiber Coupler for Expanded Output-Mode Diameter," IEEE Photonics Letters, vol. 9, No. 4, Apr. 1997, pp. 425-427, IEEE.

Skovgaard, P.M.W., et al., "Inhomogeneous Pumping and Increased Filamentation Threshold of Semiconductor Lasers by Contact Profiling," Electronics Letters, vol. 34, No. 20, Oct. 1, 1998, 2 pages.

Salet, P., et al., "1.1-W Continuous-Wave 1480-nm Semiconductor Lasers with Distributed Electrodes for Mode Shaping," IEEE Photonics Technology Letters, vol. 10, No, 12, Dec. 1998, pp. 1706-1708, IEEE.

Baoxue, B., et al., "Rhombus-Like Stripe BA in GaAs—AlGaAs—GaAs Lasers," IEEE Photonics Technology Letters, vol. 16, No, 5, May 5, 2004, pp. 1248-1249, IEEE.

Haag, M., et al., "Novel High-Brightness Fiber Coupled Diode Laser Device," Proc. SPIE, vol. 6456, 2007, 8 pages.

Lindsey, C., et al., "Fundamental lateral mode oscillation via gain tailoring in broad area semiconductor lasers," Applied Physics Letters, vol. 47, No. 6, Sep. 15, 1985, pp. 560-562, American Institute of Physics.

Baoxue, B., et al., "Rhombus-Like Stripe BA InGaAs—AlGaAs—GaAs Lasers," IEEE Photonics Technology Letters, vol. 16, No. 5, May 2004, pp. 1248-1249, IEEE.

* cited by examiner

PRIOR ART

FIG 16
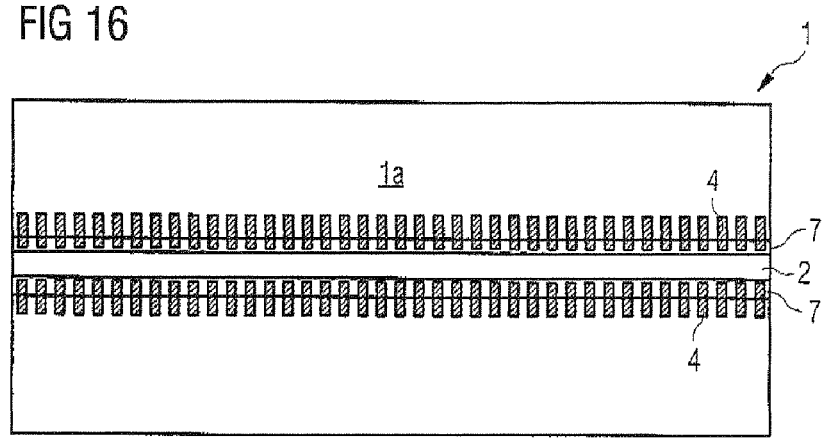
FIG 17
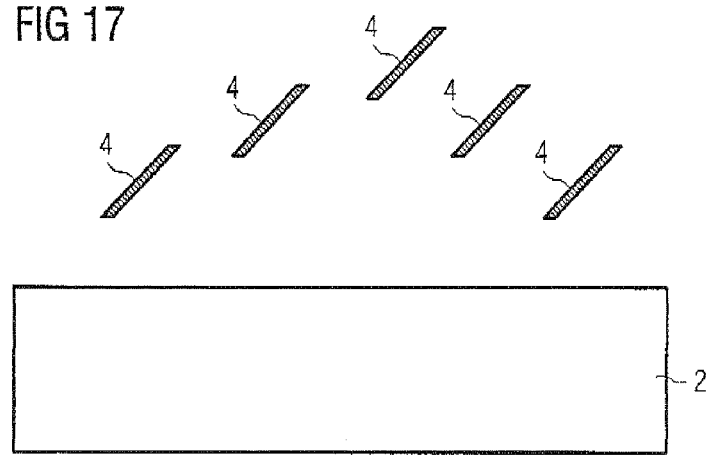
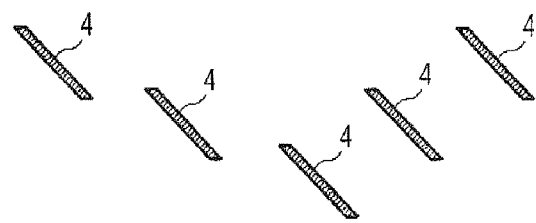

EDGE EMITTING SEMICONDUCTOR LASER CHIP

This patent application is a national phase filing under section 371 of PCT/DE2009/001482, filed Oct. 21, 2009, which claims the priority of German patent application 10 2008 058 436.3, filed Nov. 21, 2008,each of which is incorporated herein by reference in its entirety.

TECHNICAL FIELD

An edge emitting semiconductor laser chip is specified.

SUMMARY

One aspect of the invention specifies an edge emitting semiconductor laser chip having particularly good beam quality.

An edge emitting semiconductor laser chip is specified. The edge emitting semiconductor laser chip is a broad strip laser, for example, which can comprise one or a plurality of emitters. If the broad strip laser comprises a plurality of emitters, then a plurality of laser beams that are spaced apart from one another can be emitted by the edge emitting semiconductor laser chip during operation.

In accordance with at least one embodiment of the edge emitting semiconductor laser chip, the edge emitting semiconductor laser chip comprises a semiconductor body. The semiconductor body has an epitaxially grown layer sequence, for example.

In this case, the semiconductor body can comprise at least one active zone that is part of the epitaxially grown layer sequence. During the operation of the semiconductor laser chip, electromagnetic radiation is generated and amplified in the active zone. By way of example, the active zone comprises one or a plurality of quantum wells, quantum wires or quantum dots.

In accordance with at least one embodiment of the edge emitting semiconductor laser chip, the semiconductor laser chip comprises a contact strip. The contact strip is preferably arranged at a top surface at the top side of the semiconductor body. The contact strip can be an electrode via which electric current can be impressed into the semiconductor body. The electrode can be applied to the top surface of the semiconductor body as a strip-type metallization, for example. Furthermore, it is also possible for the contact strip to be defined by means of a strip-type perforation in a passivation layer on the top surface of the semiconductor body. A metal layer can be applied to the passivation in large-area fashion. The metal layer is then situated in contact with the semiconductor body only in the region of the perforation.

Electromagnetic radiation is generated in the active zone of the semiconductor body by means of the impressed electric current. The electromagnetic radiation is generated in the active zone below the contact strip. The emitter of the semiconductor laser chip is therefore situated there. If the semiconductor laser chip has a plurality of contact strips at the top surface of the semiconductor body, then laser radiation is generated below each contact strip. The semiconductor laser chip then has a plurality of emitters, the number of which corresponds at most to the number of contact strips on the top surface. The edge emitting semiconductor laser chip is therefore an electrically pumped semiconductor laser chip.

The contact strip is arranged for example as a metallization on the top surface of the semiconductor body. In this case, the contact strip can extend along the main emission direction of the electromagnetic radiation generated in the active zone. The main extension direction of the contact strip is then parallel to the main emission direction of the emitter which is assigned to the contact strip. By way of example, the contact strip extends as a strip of uniform width along the main emission direction of the electromagnetic radiation generated in the semiconductor body.

In accordance with at least one embodiment of the edge emitting semiconductor laser chip, the edge emitting semiconductor laser chip comprises at least one, preferably at least two delimiting structures for delimiting the current spreading in the semiconductor body between the contact strip and the active zone. The delimiting structures prevent excessively great current spreading between the contact strip and the active zone. That is to say that current which is impressed into the semiconductor body through the contact strip is prevented from spreading for example in a lateral direction—the direction running in the plane of the top surface perpendicularly to the main extension direction of the contact strip. As a result, a high current and charge carrier density is present directly below the contact strip in the active zone, whereas the current density decreases with distance from the contact strip. That is to say that in the active zone a current density forms which can have a local maximum in that region of the active zone which lies directly below the contact strip.

In accordance with at least one embodiment of the semiconductor laser chip, the delimiting structures are arranged on both sides of the contact strip. That is to say that the edge emitting semiconductor laser chip comprises at least two delimiting structures, wherein in each case at least one delimiting structure is arranged on the left and respectively on the right of the contact strip, as seen in the direction of the main extension direction of the contact strip. By way of example, the delimiting structures are arranged symmetrically with respect to the contact strip, wherein a longitudinal central axis of the contact strip forms the axis of symmetry.

However, it is also conceivable for the at least one delimiting structure to be arranged only on one side of the contact strip.

In accordance with at least one embodiment of the edge emitting semiconductor laser chip, the semiconductor laser chip comprises a semiconductor body, which comprises at least one active zone in which electromagnetic radiation is generated during the operation of the semiconductor laser chip. Furthermore, the semiconductor laser chip comprises at least one contact strip arranged on a top surface at a top side of the semiconductor body. The semiconductor laser chip additionally comprises two delimiting structures for delimiting the current spreading between the contact strip and the active zone, wherein the delimiting structures are arranged on both sides of the contact strip.

In particular, the delimiting structures for delimiting the current spreading are not current barriers. That is to say that the delimiting structures inhibit, but do not completely prevent, lateral current spreading, that is to say current spreading in directions transversely with respect to the main extension direction of the contact strip. In other words, despite the delimiting structures, even in edge regions of the active zone that are further away from the contact strip than the central region of the active zone lying directly below the contact strip, energization and thus generation of electromagnetic radiation can be effected. However, reduced energization is effected in the edge regions of the active zone on account of the delimiting structures, such that the current density has a local maximum in the active zone in the region of the contact strip. The charge carrier density profile produced in this way leads to an increase in the overlap of the lateral gain profile of the semiconductor laser chip with low lateral modes and a reduction of the overlap with higher modes.

Furthermore, the charge carrier density profile discussed leads to a corresponding spatial variation of the refractive index in the active zone by way of the plasma effect in the edge region of the active zone. As a result, the wave of electromagnetic radiation generated in the active zone is scattered and subjected to losses. This mechanism has a greater effect on higher lateral modes than on lower lateral modes—for example the fundamental mode. Overall, therefore, by means of the delimiting structures, the lower lateral modes are preferred in terms of their excitation, whereas the excitation of higher lateral modes is suppressed. By way of example, the specified configuration of the semiconductor laser chip makes it possible to amplify laser radiation of the lateral fundamental mode in comparison with higher modes to a greater extent than would be the case without the specified configuration of the semiconductor chip. On account of the delimiting structures, higher-mode laser radiation is pumped to a lesser extent and, if appropriate, subjected to scattering losses. The higher modes then cannot start to oscillate.

The delimiting structures are not current barriers, in which a trench is etched right into the active zone in order to prevent lateral current spreading, which trench can be filled with an absorber material. On account of the fact that the delimiting structures are not current barriers, the delimiting structures, in contrast to current barriers, can be led particularly close to the contact strip. This can be done without damaging the active zone—for example by etching. The damage would lead to an impairment of the efficiency and the service life of the edge emitting semiconductor laser chip. In contrast to a current barrier, by means of the delimiting structures, the impressed current is not constricted to a small region, but rather attenuated in a lateral direction in such a way that higher lateral modes are pumped only to a reduced extent.

The delimiting structures preferably do not extend right into the active zone. The active zone preferably always remains free of the delimiting structures.

In accordance with at least one embodiment of the edge emitting semiconductor laser chip, the semiconductor laser chip comprises a multiplicity of delimiting structures arranged in a manner spaced apart from one another in a main extension direction of the contact strip. That is to say that the semiconductor laser chip comprises three or more delimiting structures. The delimiting structures can be arranged on both sides of the contact strip. Adjacent delimiting structures are arranged in a manner spaced apart from one another along the main extension direction of the contact strip on a same side of the contact strip. That is to say that the delimiting structures on one side of the contact strip in this embodiment are not interlinked, but rather are separated from one another by regions in which no delimiting structures are present. By way of example, the distance is at least 5 µm, for example 10 µm.

In accordance with at least one embodiment of the edge emitting semiconductor laser chip, the semiconductor body of the semiconductor laser chip comprises a contact layer, which adjoins the contact strip. The contact layer is that layer of the semiconductor body which comprises the top surface. The contact layer is formed with a highly doped semiconductor material and serves for spreading current impressed through the contact strip in a lateral direction, that is to say transversely with respect to the main extension direction of the contact strip.

The semiconductor body furthermore comprises a cladding layer, which adjoins that side of the contact layer which is remote from the contact strip.

The semiconductor body furthermore comprises a waveguide layer, which adjoins that side of the cladding layer which is remote from the contact layer. With its side remote from the cladding layer, the waveguide layer adjoins the active zone of the semiconductor laser chip. In this case, the active zone is enclosed by two waveguide layers, which can be embodied identically or differently.

The waveguide layer has a higher band gap and a lower optical refractive index than the active zone. The cladding layer in turn has a higher band gap and a lower optical refractive index than the waveguide layer. The electromagnetic radiation generated in the semiconductor body during the operation of the semiconductor laser chip propagates along the contact strip in the waveguide layer and in the cladding layer.

In accordance with at least one embodiment of the edge emitting semiconductor laser chip, at least one of the delimiting structures extends right into the cladding layer, wherein the waveguide layer is free of the delimiting structure. That is to say that the delimiting structure extends through the contact layer into the cladding layer. The contact layer itself is perforated by the delimiting structure in places. By way of example, it is possible for at least one of the delimiting structures to extend precisely as far as the cladding layer.

Depending on the magnitude of the current impressed through the contact strip, the perforation of the contact layer can be sufficient in this case. For higher currents, however, it can be necessary for the delimiting structure to extend right into the cladding layer in order to obtain a sufficient restriction of the current spreading. By way of example, at least one of the delimiting structures extends as far as a distance of at least 300 nm in front of the waveguide layer. In this case, it is also possible for all the delimiting structures to extend right into the cladding layer. By way of example, it is then also possible for all the delimiting structures to have the same penetration depth into the semiconductor body. That is to say, for example, that all the delimiting structures can extend as far as 300 nm above the waveguide layer.

In accordance with at least one embodiment of the edge emitting semiconductor laser chip, at least one delimiting structure extends into the waveguide layer, wherein the active zone remains free of the delimiting structure. That is to say that the delimiting structure penetrates through the contact layer and the cladding layer and extends at least as far as the waveguide layer and can extend into the latter. Such a delimiting structure constitutes particularly effective delimiting of the current spreading between contact layer and active zone. However, the active zone remains free of the delimiting structure, such that the delimiting structure is not a current barrier that completely prevents impression beyond it into the active zone. By way of example, the delimiting structure extends into the waveguide layer as far as a penetrating depth of at least 150 nm above the active zone. In this case, it is once again possible for all the delimiting structures of the semiconductor laser chip to extend into the waveguide layer and in this case to have the same penetration depth into the semiconductor body.

In addition, it is possible for the delimiting structures to differ from one another with regard to their penetration depth. By way of the penetration depth of the delimiting structures in the semiconductor body it is possible, by way of example, to adapt the routing of current along the contact strip. In this case, it is possible for the delimiting structures to extend right into the cladding layer, but not into the waveguide layer, whereas other delimiting structures extend right into the waveguide layer but not right into the active zone.

In accordance with at least one embodiment of the edge emitting semiconductor laser chip, the delimiting structures are arranged with a filling factor of at least 10% on both sides of the contact strip. In this case, the filling factor is understood to mean the ratio of the sum of the maximum widths of the delimiting structures in the main extension direction of the contact strip to the total length of the contact strip. If, by way of example, a single delimiting structure extends on one side along the entire contact strip, then the filling factor is 100%. If the sum of the maximum widths of the delimiting structures is precisely 10% of the length of the contact strip, then the filling factor is 10%. In this case, the filling factor can be determined separately for the two sides—on the left and right with respect to the contact strip—and differ for the two sides. Preferably, however, the filling factor is chosen to be identical on both sides of the contact strip and is at least 10% on both sides.

In accordance with at least one embodiment of the edge emitting semiconductor laser chip, the delimiting structures are arranged with a filling factor of at most 90% on both sides of the contact strip. That is to say that in this embodiment it is preferred if the delimiting structures do not extend in uninterrupted fashion along the entire length of the contact strip.

In this case, it is possible for the filling factor to vary locally in a lateral direction, that is to say in a direction transversely, for example perpendicularly, with respect to the main extension direction of the contact strip. By way of example, the delimiting structures can taper in a direction toward the contact strip and/or in a direction away from the contact strip. Through the choice of the form of the delimiting structures and also the choice of their maximum width, it is possible to set the effect of the delimiting structures on the current spreading and also on the scattering of the electromagnetic radiation generated in the active zone.

In accordance with at least one embodiment of the edge emitting semiconductor laser chip, at least one delimiting structure is arranged at a distance of at most 30 µm laterally with respect to the contact strip. In this case, the distance between the contact strip and the delimiting structure is measured from that side surface of the contact strip which faces the delimiting structure to that point of the delimiting structure which lies closest to the contact strip along a direction running parallel to the plane of the top surface of the semiconductor body and perpendicularly to the main extension direction of the contact strip. The delimiting structure can extend over a number of micrometers in this direction. Arranging the delimiting structure so closely to the contact strip leads to a particularly good concentration of the charge carrier density in the active zone in regions directly below the contact strip. In this case, the delimiting structure can also project into the contact strip. In this case, the distance between the contact strip and the delimiting structure is, for example, from at least −30 µm to at most 30 µm, preferably from at least −20 µm to at most 10 µm.

In accordance with at least one embodiment of the edge emitting semiconductor laser chip, the delimiting structures are arranged within two delimiting strips on both sides of the contact strip, wherein the delimiting strips each have a width of at most 1 mm. The width is preferably less than 250 µm, particularly preferably less than 100 µm, for example 60 µm. That is to say that, at both sides of the contact strip, in this embodiment, the maximum distance between the contact strip, that is to say between that side surface of the contact strip which lies closest to the delimiting structure, and that end of the respective delimiting structure which is furthest away from the contact strip is at most 1 mm. That is to say that the delimiting structures in this embodiment are arranged in strips on the left and right of the contact strip which have a width of at most 1 mm. In this case, it has been found that such small widths of the delimiting strip are sufficient for effectively delimiting current spreading between contact strip and active zone.

In accordance with at least one embodiment of the edge emitting semiconductor laser chip, at least one of the delimiting structures is formed by an implantation region in the semiconductor body. By way of example, it is then possible for all the delimiting structures to be formed by an implantation region in the semiconductor body.

That is to say that the delimiting structure is formed by a spatially extensive region in the semiconductor body which is produced by the implantation of ions into the crystal lattice of the semiconductor body. Depending on the penetration depth of the delimiting structure into the semiconductor body, ions are implanted into the crystal lattice of the semiconductor body right into the cladding layer or right into the waveguide layer. The implantation of ions greatly reduces the electrical conductivity in the semiconductor body and largely prevents the current spreading in the region of the delimiting structure. In this way, the implanted profile is mapped as a gain profile of the semiconductor laser.

By way of example, protons can be implanted into the semiconductor body.

In accordance with at least one embodiment of the edge emitting semiconductor laser chip, at least one of the delimiting structures is formed by a cutout in the semiconductor body. By way of example, it is then possible for all the delimiting structures to be formed by a cutout in the semiconductor body.

That is to say that the delimiting structure is formed by a cutout, in the region of which the material of the semiconductor body is removed. By way of example, the cutout forming the delimiting structures can be formed by etching.

In accordance with at least one embodiment of the edge emitting semiconductor laser chip, the cutout is filled with a filling material that is different than the semiconductor body. By way of example, a material such as silicon nitride, germanium and/or a metal such as gold or platinum is introduced into the cutout forming a delimiting structure. In this case, the cutout is not necessarily completely filled by the material, rather it has proved to be sufficient if the cutout is covered by the material in a thin layer at its opening facing the top surface of the semiconductor body. That is to say that only the side surfaces and the bottom surface of the cutout are then filled with the filling material, without the cutout being filled fully by the filling material.

Furthermore, the cutout can be separated by a filling line in a direction parallel to the contact strip. From the contact strip as far as the filling line, the cutout is free of a solid filling material and is filled with air, for example. Proceeding from the filling line, in a direction away from the contact strip, the cutout is then filled with the filling material.

The cutout can also be totally free of a filling material. Air is then situated in the cutout.

The filling material can be an optical absorber that absorbs impinging electromagnetic radiation. As a result, their effect of the delimiting structures, besides the property for delimiting the current spreading, is intensified by scattering and/or absorption of the electromagnetic wave entering them. The absorber is amorphous germanium, for example, which is distinguished by a high refractive index and high optical losses of the electromagnetic radiation that penetrates into the germanium.

On account of their position laterally with respect to the contact strip, predominantly higher lateral modes of the semiconductor laser are suppressed in this case.

In accordance with at least one embodiment of the edge emitting semiconductor laser chip, the semiconductor body is additionally doped in the cutout, at least in the region of a bottom surface of the cutout. By way of example, the semiconductor body can be doped with germanium there. A pn-pn structure is formed in the semiconductor body by means of the doping, which structure can likewise intensify the absorption of the incident electromagnetic wave. In this case, it is also possible for the semiconductor body to be doped in the entire region of the cutout—that is to say at the bottom surface and side surfaces of the cutout.

In accordance with at least one embodiment of the edge emitting semiconductor laser chip, at least one delimiting structure comprises a roughening of the semiconductor body.

On account of the roughening, the wave circulating in the semiconductor laser chip is scattered statistically in the outer region of the emitter, as a result of which higher lateral modes are suppressed further in the semiconductor laser chip. Furthermore, ring resonances are avoided on account of the statistical scattering by means of the roughening of the semiconductor body. In this case, it is possible for all the delimiting structures of the semiconductor body to comprise such a roughening. By way of example, the delimiting structure can be a cutout in the semiconductor body. The bottom surface of the cutout, that is to say the deepest location of the cutout remote from the top surface, can be statistically roughened. Furthermore, the roughening can for example also be combined with the filling of the cutout with a filling material. That is to say that, for example, the bottom surface of a cutout can be roughened and the cutout can simultaneously be filled with a filling material that is different than the material of the semiconductor body.

In accordance with at least one embodiment of the edge emitting semiconductor laser chip, at least one of the delimiting structures comprises a side surface adjoining the semiconductor body. If the delimiting structure is an implantation region in the semiconductor body, for example, then the side surface of the delimiting structure is formed by the outer surface of the implantation region with which the implantation region is adjacent to the adjoining semiconductor body. Alongside a side surface, the delimiting structure has a bottom surface running parallel or substantially parallel to the top surface of the semiconductor body.

In accordance with at least one embodiment of the edge emitting semiconductor laser chip, the delimiting structure has at least one side surface which forms an angle of at least 20° and at most 80°, for example between at least 30° and at most 70°, with the top surface of the semiconductor body. Preferably, this then holds true for all the side surfaces of the delimiting structure. In this case, the angle range discussed has proved to be advantageous in particular for delimiting structures which extend into the cladding layer or into the waveguide layer. In the case of shallower or steeper angles, the electromagnetic wave circulating in the semiconductor laser chip is scattered back and forth or not at all. For delimiting structures having side surfaces which run in the specified angle range with respect to the top surface, the scattering into the radiation-absorbing contact layer or the radiation-absorbing substrate is increased, however. Furthermore, delimiting structures having flank angles in the stated range, on account of the more abrupt transition when the wave enters the delimiting structure, have a greater scattering effect than delimiting structures having smaller flank angles, since coupling losses at the interface between delimiting structure and semiconductor body are then increased.

In accordance with at least one embodiment of the edge emitting semiconductor laser chip, at least one delimiting structure has a side surface adjoining the semiconductor body, wherein the side surface forms an angle of between 15° and 75° with the main extension direction of the contact strip. That is to say that, in a plan view of the top surface of the semiconductor laser chip, the delimiting structures in this exemplary embodiment have side surfaces which do not run perpendicularly to the contact strip, but rather form an angle of between at least 15° and at most 75° with the main extension direction of the contact strip. That is to say that the side surfaces of the delimiting structures do not run parallel and/or perpendicularly to the facets of the semiconductor laser which are preferably oriented perpendicularly to the main extension direction of the contact strip. The side surfaces of the delimiting structure therefore form an angle of not equal to 90° and/or 0° with the emission direction of the semiconductor laser. Electromagnetic radiation impinging on the side surfaces is thus scattered away from the emitter. Furthermore, the side surfaces do not necessarily run parallel to one another. That is to say that the side surfaces of the delimiting structures can form angles of greater than 0° with one another.

In accordance with at least one embodiment of the edge emitting semiconductor laser chip, current barriers are arranged along the main extension direction of the contact strip on both sides of the contact strip, wherein the contact strip and the delimiting structures are arranged laterally between the current barriers. That is to say that the current barriers, on the left and right of the contact strip, enclose the latter and the delimiting structures at the contact strip. The current barriers are formed for example by V-shaped trenches extending as far as the active zone. The V-shaped trenches can be filled with a radiation-absorbing material such as amorphous germanium, for example.

Electromagnetic radiation scattered away from the active zone and the contact strip by the delimiting structures, for example, can be absorbed by the current barriers, such that no penetration of the radiation into adjacent emitters of the semiconductor laser chip can arise. Furthermore, the current barriers also prevent current impressed into the semiconductor laser chip through the contact strip from being able to pass from one emitter to an adjacent emitter of the semiconductor laser chip. That is to say that the current barriers can be arranged between the individual emitters and thus between the contact strips of the individual emitters. Therefore, they prove to be particularly advantageous in particular also for the case where the semiconductor laser chip comprises a plurality of emitters.

BRIEF DESCRIPTION OF THE DRAWINGS

The edge emitting semiconductor laser chip described here is explained in greater detail below on the basis of exemplary embodiments and the associated figures.

FIGS. 7 to 17 to show schematic plan views for exemplary embodiments of edge emitting semiconductor laser chips described herein.

In the exemplary embodiments and figures, identical or identically acting constituent parts are in each case provided with the same reference symbols. The elements illustrated should not be regarded as true to scale; rather, individual elements may be illustrated with an exaggerated size in order to afford a better understanding.

DETAILED DESCRIPTION OF THE ILLUSTRATIVE EMBODIMENTS

Figure 1:
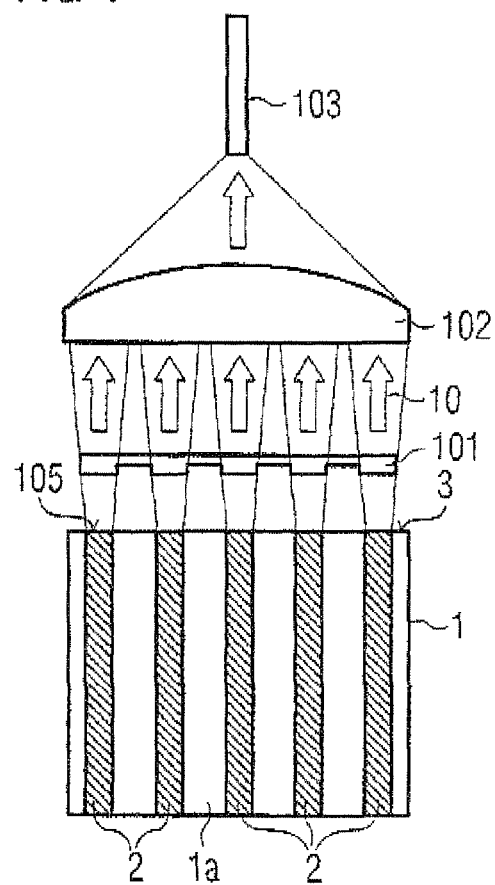
FIG. 1 shows the coupling of laser radiation into a fiber-optic system on the basis of a schematic plan view.

FIG. 1 shows, on the basis of a schematic plan view, the coupling of laser radiation 10, generated by an edge emitting semiconductor laser chip 1, into a fiber-optic system 103. In this case, FIG. 1 shows an edge emitting semiconductor laser chip 1 embodied for example as a laser bar comprising five emitters 105. For this purpose, the edge emitting semiconductor laser chip has five contact strips 2 at its top surface 1a. Five laser beams 10 are coupled out at the coupling-out facet 3, and firstly pass through a micro-optical unit 101. By means of a further optical element 102, which is a converging lens, for example, the laser radiation is combined and coupled into the fiber-optic system 103.

Technical progress in the realization of fiber lasers and fiber-coupled lasers which enable excellent beam quality and high achievable output powers allow the lasers to be used for example in new industrial applications such as "remote" welding. Edge emitting semiconductor laser chips are usually used as the pump light source. They afford a very high efficiency in the conversion of the electrically expended power into usable radiation power in conjunction with high optical output power. On the other hand, however, they exhibit a high ellipticity of the far field. Efficient coupling of the laser radiation into the round fiber cross section of a fiber-optic system 103 can be achieved only with the aid of expensive micro-optical units 101 that are complicated to adjust.

Simplification and improvement of the fiber coupling of the laser diodes would lead to more cost-effective and more reliable laser systems. The adjustment complexity of the micro-optical units is drastically reduced if the beam divergence were smaller at least in the lateral direction r (which is narrower anyway)—the so-called slow-axis direction—and the beam has to be greatly transformed for efficient fiber coupling only in the vertical direction—that is to say in the direction perpendicular to the plane in which, for example, the top surface 1a of the semiconductor laser chip lies.

In this case, the lateral direction r is that direction which runs perpendicular to the main extension direction R of the contact strip 2 in a plane parallel to the top surface 1a. The main extension direction R of the contact strip 2 runs parallel to the propagation direction of the electromagnetic radiation 10 generated during the operation of the edge emitting semiconductor laser chip 1.

Figure 2:
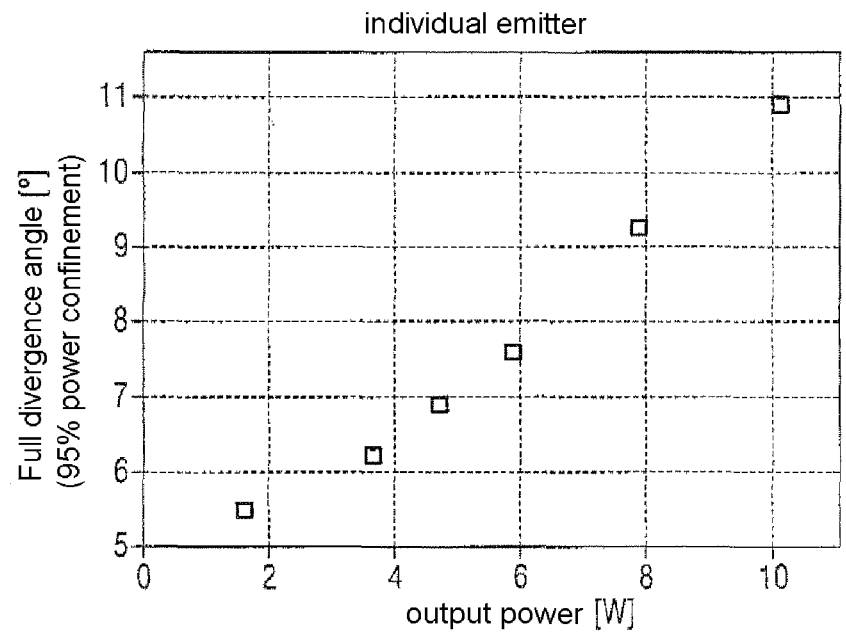
FIG. 2 shows plotted measured values of the beam divergence in angular degrees against the output power of an edge emitting semiconductor laser chip.

FIG. 2 shows plotted measured values of the beam divergence in angular degrees against the output power of an edge emitting semiconductor laser chip per emitter 105. In this case, the beam divergence was determined with 95% power confinement. The beam divergence was determined in the "slow axis" (SA) direction, that is to say in a lateral direction r in a plane running parallel to the top surface 1a and perpendicularly to the main extension direction R of the contact strip 2 (in this respect, also see FIG. 1). "95% power confinement" means that only that region of the laser beam 10 which confines 95% of the output power was taken into consideration for determining the beam divergence.

As can be seen from the figure, the horizontal beam divergence increases greatly as the output power of the laser rises. This makes it more difficult to use the edge emitting semiconductor laser chip for high light powers as described above, since the small micro-optical units 101 preferably used can then be overly irradiated laterally and light is lost.

Figure 3:
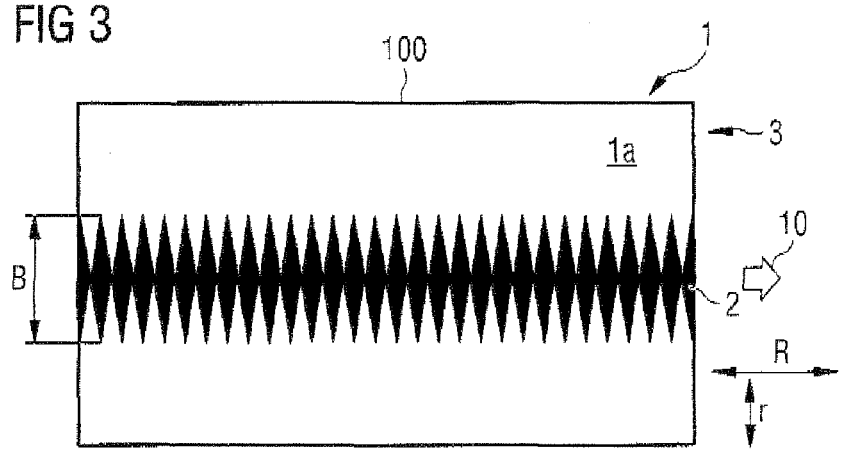
FIG. 3 shows an edge emitting semiconductor laser chip in accordance with the prior art.

FIG. 3 shows, in a schematic plan view, an edge emitting semiconductor laser chip in accordance with the prior art.

The edge emitting semiconductor laser chip 1 comprises a semiconductor body 100, which has a top surface 1a at its top side. A structured contact strip is applied on the top surface 1a. In this case, the contact strip 2 is subdivided into rhomboidal sections. It has a width B of approximately 150 µm. With a low power density or current density of 0.8 kA/cm$^2$, the edge emitting semiconductor laser chip is distinguished by a significant reduction of the lateral divergence of the emitted electromagnetic radiation by comparison with a reference structure having an unstructured contact strip 2 having a constant width B. Such a semiconductor laser chip is described for example in the publication Baoxue et al., "Rhombus-like stripe BA InGaAs—AlGaAs GaAs lasers", PTL 16, no. 5, 1248-1249 (2004), the disclosure content of which is hereby expressly incorporated by reference.

Figure 4:
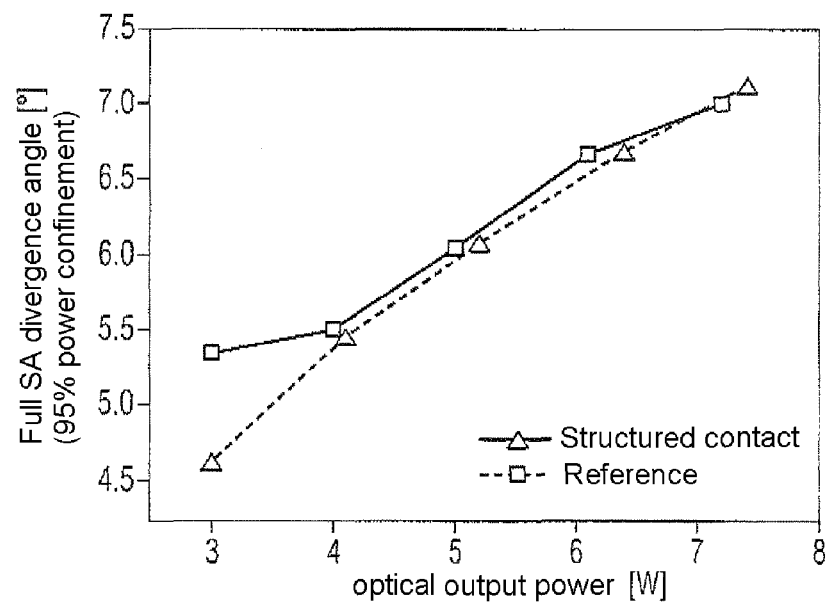
FIG. 4 shows plotted measured values of the beam divergence in angular degrees against the output power for two edge emitting semiconductor laser chips.

In FIG. 4, the beam divergence is then schematically plotted against the optical output power for a semiconductor laser chip having the structured contact in accordance with FIG. 3 and also for a semiconductor laser chip without a structured contact, which serves as a reference structure. In this case, optical output power of 3 watts corresponds to current density of approximately 0.8 kA/cm$^2$ in the edge emitting semiconductor laser chip. Optical output power of 7 watts corresponds to current density of approximately 1.8 kA/cm$^2$ in the semiconductor laser chip. As can be gathered from FIG. 4, the advantage of low beam divergence disappears at relatively high optical output powers starting from approximately 4 watts. A semiconductor laser chip having a rhomboidally structured contact strip 2 therefore does not afford an advantage with regard to a reduced beam divergence for high optical output powers and hence high current densities.

Measures which make it possible to achieve an effective reduction of the horizontal beam divergence by comparison with conventional edge emitting semiconductor laser chips even in the case of high optical output powers of a plurality of watts and in the case of an emitter width of approximately 100 µm will now be explained in greater detail in conjunction with the following figures.

Figure 5:
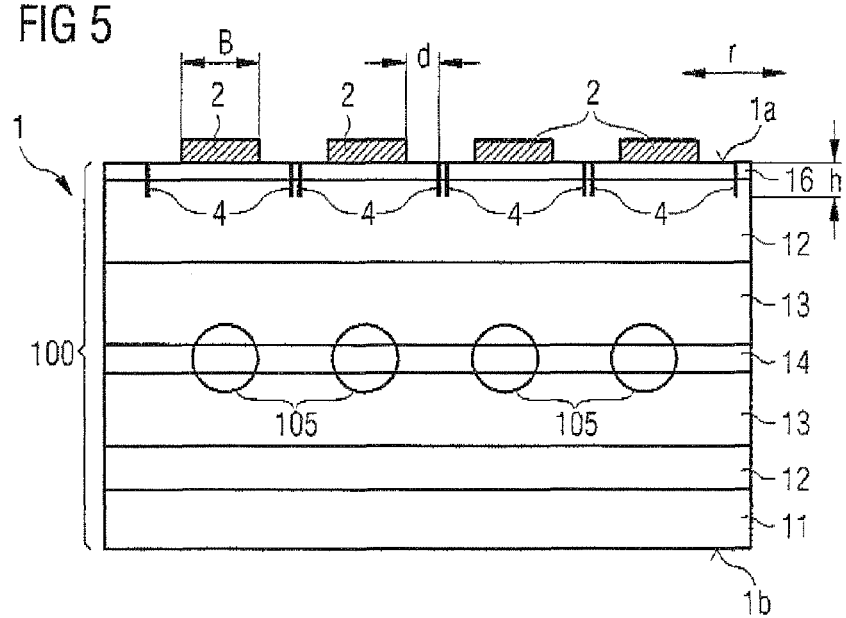
FIG. 5 shows, on the basis of a schematic sectional illustration, an exemplary embodiment of an edge emitting semiconductor laser chip described herein.

FIG. 5 shows a schematic sectional illustration of an exemplary embodiment of a semiconductor laser chip 1 described herein. The edge emitting semiconductor laser chip 1 described herein is preferably a so-called broad strip laser. Broad strip lasers operate laterally in multimode fashion and tend toward filamenting especially at high optical output powers. That is to say that local excessive increases in power occur in conjunction with a reduction of the spatial coherence of the electromagnetic radiation 10 generated. Furthermore, broad strip lasers tend toward distortion of the phase front of the electromagnetic radiation 10 generated, which leads to a widening of the beam divergence in a lateral direction.

The edge emitting semiconductor laser chip 1 described herein can in this case be produced in different material systems. By way of example, a semiconductor laser chip based on one of the following semiconductor materials is involved: GaP, GaAsP, GaAs, GaAlAs, InGaAsP, GaN, InGaN, AlGaInAsSb. Moreover, further semiconductor materials from the III-V or II-VI semiconductor systems are also conceivable. For example, the semiconductor laser chip is based on the AlGaInAs material system. In this case, "is based" means that at least one layer of the semiconductor body is formed from one of the materials mentioned. The layer can additionally contain dopants.

The edge emitting semiconductor laser chip 1 is for example a diode laser having a multiplicity of emitters, for example having four to six emitters, which has a resonator length of greater than 1 mm, for example between 1.5 and 6 mm. The width of the radiation 10 generated by the individual emitters 105 is preferably between 50 μm and 150 μm in a lateral direction r. In this case, it is also possible for the edge emitting semiconductor laser chip to comprise a single emitter.

Contact strips 2 are situated on the top surface 1a of the semiconductor body 100 of the edge emitting semiconductor laser chip 1, wherein each contact strip 2 is assigned to an emitter 105. The edge emitting semiconductor laser chip 1 can generate electromagnetic radiation 10 in the spectral range from infrared radiation to UV radiation during operation.

An edge emitting semiconductor laser chip 1 for high output powers in the spectral range of infrared radiation has, in contrast to lasers for lower output powers, very thick waveguide layers 13, the thickness of which can be in the range of a plurality of micrometers.

Particularly in the case of these infrared-emitting edge emitting semiconductor laser chips 1, the following problem occurs.

These semiconductor laser chips 1 have very thick waveguide layers. On account of the high current spreading in the thick waveguide layer 13 between the active zone 14 and the contact strip 2, the structuring of a contact strip 2, as explained in conjunction with FIG. 3, is no longer mapped as a gain profile right into the active zone 14. Rather, the active zone is energized virtually uniformly, in a similar manner as if the contact strip 2 were unstructured.

The edge emitting semiconductor laser chip 1 comprises a semiconductor body 100. The semiconductor body 100 comprises a substrate 11, which can be for example a growth substrate, onto which the subsequent layers of the semiconductor body 100 are deposited epitaxially. The edge emitting semiconductor laser chip 1 can be contact-connected on the n-side, for example, via the substrate 11.

Furthermore, the edge emitting semiconductor laser chip 1 comprises in its semiconductor body 100 an active zone 14 provided for generating electromagnetic radiation. In this case, the active zone 14 can comprise for example a pn junction, a double heterostructure, a single quantum well structure or a multiple quantum well structure for generating radiation. The designation quantum well structure herein does not exhibit any significance with regard to the dimensionality of the quantization. It therefore encompasses, inter alia, quantum wells, quantum wires and quantum dots and any combination of these structures.

The active zone 14 is embedded into waveguide layers 13, which have a higher band gap and a lower refractive index than the active zone 14.

The waveguide layers 13 are adjoined by a respective coating or cladding layer 12, which differ from the waveguide layers 13 in terms of a higher band gap and a lower refractive index than the waveguide layers.

The cladding layer 12 remote from the substrate 11 adjoins the contact layer 16, which is doped more highly in p-conducting fashion than the underlying cladding layer 12. The contact strips 2 are applied on the top surface 1a of the semiconductor body 100, in a manner directly adjoining the contact layer 16. The contact strips 2 are formed by a metallization, for example. Electric current is impressed into the active zone 14 of the semiconductor laser chip 1 via the contact strips 2. The width B of the contact strips 2 is preferably between at least 10 μm and several hundred for example approximately 100 μm.

Delimiting structures 4 are arranged in a manner spaced apart from the contact strips 2 laterally, that is to say in a lateral direction r, the delimiting structures serving for delimiting the current spreading between the contact strips 2 and the active zone 14. In this case, the delimiting structures 4 are arranged on both sides of each contact strip 2.

In the exemplary embodiment in FIG. 5, the delimiting structures extend over a penetration depth h into the semiconductor body 100. In the exemplary embodiment in FIG. 5, in this case the delimiting structures 4 extend right into the cladding layer 12 and completely penetrate through the contact layer 16 in this way. By way of example, the delimiting structures extend into the cladding layer 12 as far as a depth of 300 nm above the waveguide layer 13. The waveguide layer 13 is then free of delimiting structures 4.

Alternatively, however, it is also possible for the delimiting structures to extend right into the waveguide layer 13. However, the delimiting structures 4 do not extend as far as the active zone 14, such that the active zone 14 is always free of the delimiting structures. By way of example, the delimiting structures 4 then extend into the waveguide layer 13 facing the top surface 1a as far as a depth of 300 nm above the active zone.

An uncontrolled current spreading between the contact strips 2 and the active zone 14 is prevented on account of the delimiting structures 4. That is to say that the excessively great current spreading between contact strips 2 and active zone 14 as would be the case even for a structured contact strip 2 given a thick waveguide layer 13 is prevented by the delimiting structures 4. In this way, a suitable lateral and longitudinal gain or charge carrier profile is established in the active zone 14. This leads to an increase in the overlap of the lateral gain profile in the active zone 14 with lower lateral modes, for example the lateral fundamental mode, and a reduction of the overlap for higher modes. Furthermore, the gain or charge carrier profile in the active zone 14 leads, by way of the plasma effect in the edge region of the emitter 105, to a correspondingly spatial variation of the refractive index in the active zone 14, as a result of which the electromagnetic radiation 10 generated is scattered and subjected to losses. This affects higher lateral modes, in particular. Lower lateral modes—for example the lateral fundamental mode—are hardly influenced thereby. Overall, amplification of the lower lateral modes—for example the lateral fundamental mode—is therefore preferred by the structure proposed.

In this case, the delimiting structures 4 are situated at a distance d from the contact strip 2. Preferably, the distance d is at most 30 μm.

The delimiting structures 4 can be a cutout by way of example, which can be produced by etching. That is to say that, in order to suppress the current spreading, the highly doped contact layer 16 and also, if appropriate, parts of the cladding and waveguide layers 12 and 13 are removed in structured fashion.

Instead of or in addition to etching, the delimiting structures 4 can also be implemented by implantation of ions into the crystal lattice of the semiconductor body 100. As a result, the electrical conductivity of the regions implanted with ions is greatly reduced and the current spreading is largely prevented, such that the implanted profile of the delimiting structures 4 is mapped as a gain profile into the active zone 14.

If the delimiting structures 4 are particularly deep cutouts which extend right into the waveguide layer 13, in addition to the refractive index grating induced by the charge carrier profile in the active zone 4, an optical grating is produced by the spatial change in the effective refractive index of the modes on account of the delimiting structures 4 since evanescent vertical tails of the wave of the electromagnetic radiation 10 generated propagate in the delimiting structures 14 (see FIG. 18e) in regions instead of in the waveguide layer 13 or the cladding layer 12. In this case, a filling material 41 can be introduced for example in cutouts which form the delimiting structures 4.

If the delimiting structures 4 are cutouts that are etched, then the delimiting structures can be produced in a plurality of steps. That is to say that the delimiting structures 4 can be produced in a sequence of a plurality of etching steps in the semiconductor body 100. In this way, it is possible to produce a multilevel height profile in the cutout. In this case, the cutout can be structured differently in a lateral direction and in a longitudinal direction—that is to say in a direction of the main extension direction of the contact strips 2. Alternatively, it is also possible for the cutout to be produced for example by means of a corresponding mask process in a single etching step. Furthermore, it is possible for the cutout that forms a delimiting structure to differ in terms of its height profile in the individual layers, such as contact layer 16, cladding layer 12 or waveguide layer 13.

That is to say that the cutout can have different continuous flank angles, for example, in the different layers.

Figure 6:
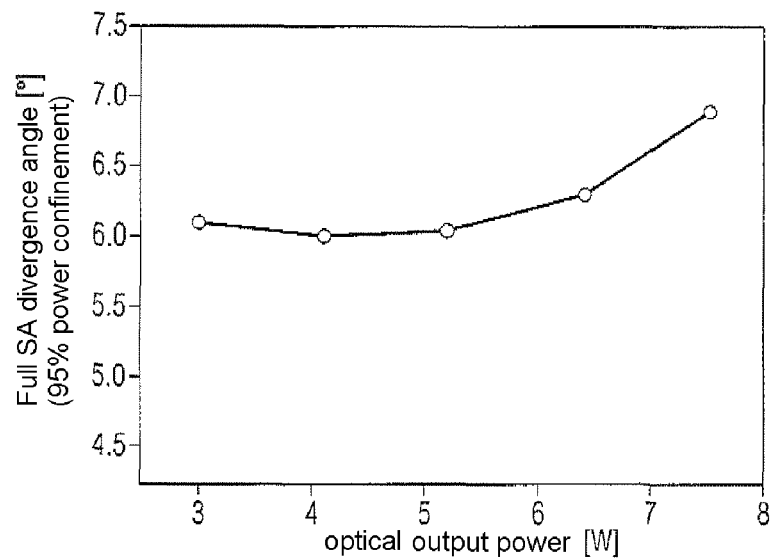
FIG. 6 shows plotted measured values in angular degrees against the output power for the edge emitting semiconductor laser chip described in conjunction with FIG. 5.
Figure 8:
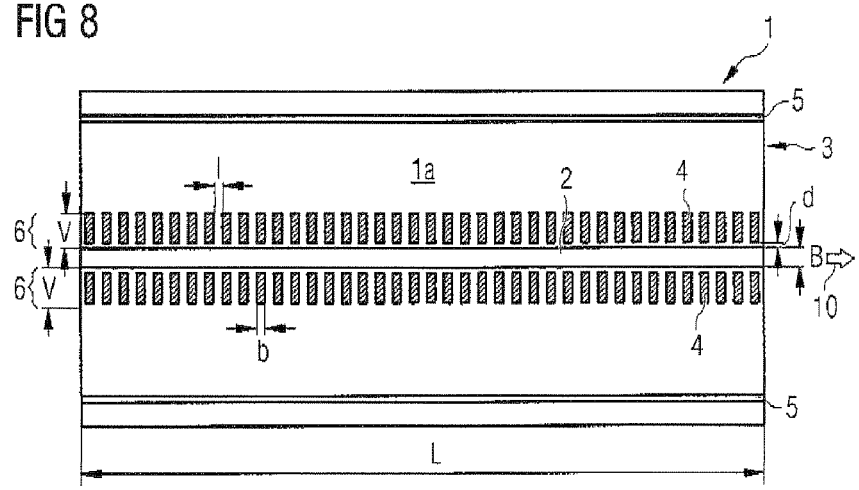

FIG. 6 shows a graphical plot of the divergence angle of the electromagnetic radiation 10 generated against the optical output power for an edge emitting semiconductor laser 1 as described in conjunction with FIGS. 5 and 8.

The distance 1 between the delimiting structures 4 on one side of the contact strip 2 is 10 μm in this case. The maximum width b of the delimiting structures 4 is in each case 10 μm. The distance d between the delimiting structures 4 and the contact strip 2 is 6 μm.

The width of the contact strip B is 70 μm. The contact strip 2 is embodied as a metallization of the top surface 1a of the semiconductor body 100 in the perforation of a passivation layer (not illustrated) composed of silicon nitride.

The delimiting structures 4 are arranged in a delimiting strip 6 on both sides of the contact strip 2, which has a width V of 60 μm. The delimiting structures 4 are etched as rectangles through the contact layer 16 into the cladding layer 12, wherein the penetration depth h is chosen such that the delimiting structures extend as far as 300 nm in front of the waveguide layer 13 facing the top surface 1a. The filling factor with which the delimiting structures 4 are arranged along the contact strip 2 is 50%. The filling factor of the delimiting structure 4 is understood to be the ratio of the sum of the maximum widths b of the delimiting structures 4 along the main extension direction R to the total length L of the contact strip 2. In this case, the total length L of the contact strip 2 is 4 mm, for example. The distance D between the current barriers 5 and the cutout strip 2 is 100 μm.

The semiconductor laser 1 comprises five emitters arranged at a distance (so-called pitch) of 1 mm from one another.

In this exemplary embodiment, the gradients of the gain profile in a lateral direction are rather flat in comparison with the gain profile in a longitudinal direction R. As can be seen from the plot in FIG. 6, a reduction of the beam divergence in a lateral direction (slow-access direction; SA) is manifested for high optical output powers. The efficiency of the edge emitting semiconductor laser and of the comparative structure without delimiting structures 4 is identical.

Figure 7:
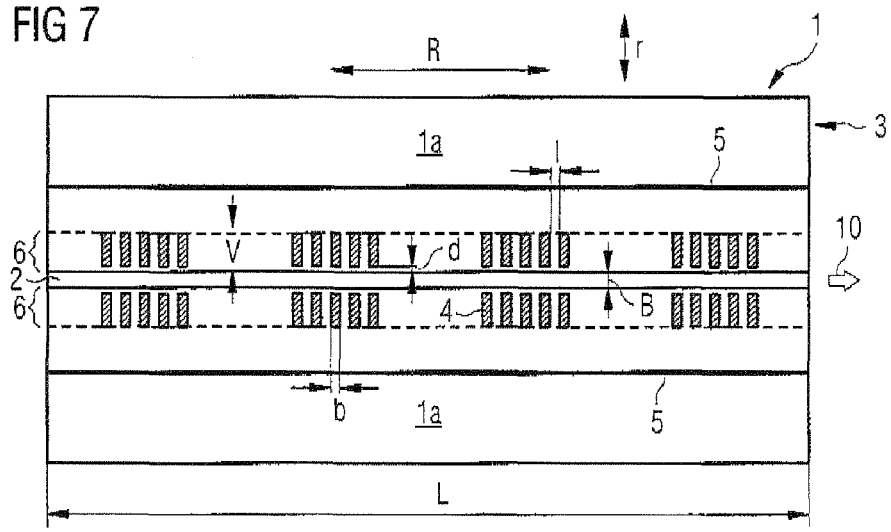

A further exemplary embodiment of an edge emitting semiconductor laser chip described herein is explained in greater detail on the basis of a schematic plan view in conjunction with FIG. 7. In contrast to the exemplary embodiment in FIGS. 5 and 8, in this exemplary embodiment the delimiting structures 4 are arranged in a plurality of groups that are respectively at a distance from one another that is greater than the distance 1 between the delimiting structures in a group. In comparison with the embodiment of the semiconductor laser chip 1 as explained in conjunction with FIGS. 5 and 8, such a structure is distinguished by the fact that delimiting structures 4 which extend right into the waveguide layer 13 can also be used here. In the exemplary embodiment described in conjunction with FIGS. 5 and 8, such a deep structuring would lead, on account of the larger number of delimiting structures, to excessively great scattering and/or damping of the circulating electromagnetic radiation 10.

On account of the relatively high current spreading in the regions in which no delimiting structures 4 are present on both sides of the contact strip 2, the gain guiding is less pronounced than in the case of the exemplary embodiment described in conjunction with FIGS. 5 and 8.

Figure 9:
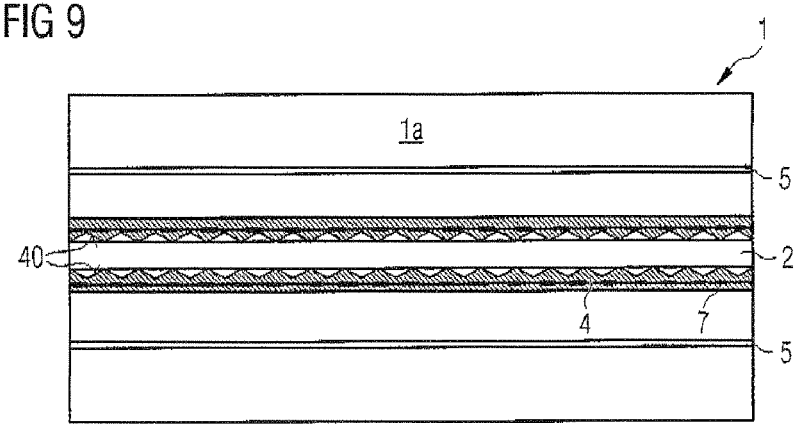

In conjunction with FIG. 9, an exemplary embodiment of an edge emitting semiconductor laser chip 1 described herein is explained in greater detail, in which the delimiting structures 4 are arranged on both sides of the contact strip 2 in each case in a single, continuous strip. In this case, the delimiting structures 4 each have, on their side facing the contact strip 2, side surfaces 40 that form an angle of not equal to 0° with the main extension direction R of the contact strip 2. In comparison, for example, with the exemplary embodiment explained in conjunction with FIG. 8, the exemplary embodiment described in conjunction with FIG. 9 is distinguished by steep gradients of the gain profile both in a lateral direction r and in a longitudinal direction R. In a lateral direction r, the charge carrier density falls steeply toward the edges of the active zone, that is to say with increasing distance from the contact strip 2. In a longitudinal direction R, the gain profile is modulated.

The delimiting structures 4 are embodied as cutouts filled with a filling material 41 starting from the filling line 7 in a manner directed away from the contact strip 2 in a lateral direction r. That is to say that those parts of the cutout which lie on that side of the filling line which faces the contact strip 2 are free of the filling material. In this case, the deeper the delimiting structures 4 extend into the semiconductor body 100, the further away the filling line 7 is from the contact strip 2.

In all the exemplary embodiments of the edge emitting semiconductor laser chip 1 described herein, a current barrier 5 can be arranged on both sides of the contact strip 2, the current barrier preventing the current from spreading beyond it. By way of example, the current barrier 5 is a V-shaped trench etching which extends as far as the active zone 14 or through the latter. The individual emitters 105 can be completely electrically and optically decoupled from one another by means of the current barrier 5.

The filling factor of the delimiting structures 4 varies in a lateral direction r. That is to say that the filling factor of the delimiting structures 4 can assume different values along an imaginary line parallel to the main extension direction R for different distances between the imaginary line and the contact strip. The filling factor is 100% in regions. At those side surfaces of the delimiting structures 4 which face the contact strip 2, the filling factor is preferably at least 10% and at most 90%.

Figure 10:
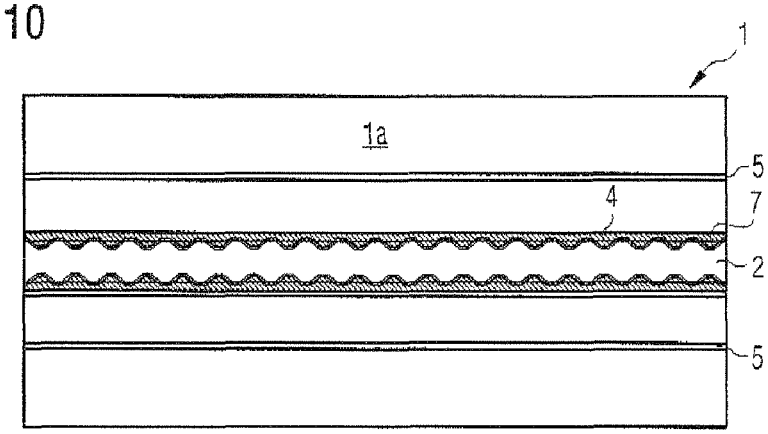

The schematic plan view in FIG. 10 of an exemplary embodiment of an edge emitting semiconductor laser chip described herein shows a variation of the exemplary embodiment described in conjunction with FIG. 9, wherein the delimiting structures 4 differ from one another with regard to the variation of the filling factor in a lateral direction.

The filling factor of the delimiting structures 4 varies in a lateral direction r. The filling factor is 100% in regions. At those side surfaces of the delimiting structures 4 which face the contact strip 2, the filling factor is preferably at least 10% and at most 90%.

Figure 11:
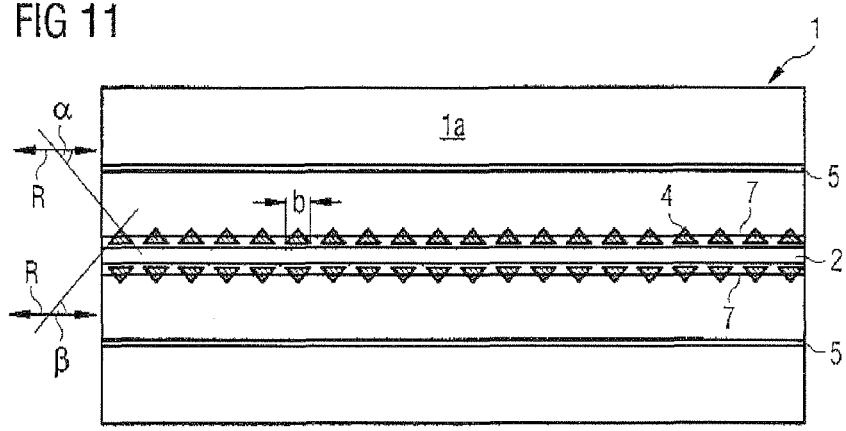

A further exemplary embodiment of an edge emitting semiconductor laser chip 1 described herein is explained in greater detail on the basis of a schematic plan view in conjunction with FIG. 11. In contrast, for example, to the exemplary embodiment of FIG. 8, the delimiting structures 4 in this exemplary embodiment, in the plan view of the top surface 1a of the semiconductor body 100 of the edge emitting semiconductor laser chip 1, are embodied as triangles, for example as isosceles triangles. The delimiting structures 4 thus have a side surface 40 that runs parallel to the main extension direction R of the contact strip 2, and two side surfaces 40 that in each case form a lateral flank angle β of not equal to 90° with the main extension direction R.

In this case, the delimiting structures lead, both in a lateral direction and in a longitudinal direction, to a steep gradient of the charge carrier density in the active zone, since the electric current impressed through the contact strip 2 can propagate past the delimiting structures 4 in a lateral direction r over a relatively large area. In the exemplary embodiment in FIG. 11, the delimiting structures each have at least two side surfaces 40, wherein the side surfaces 40 form an angle β of between preferably at least 15° and at most 75° with the main extension direction R of the contact strip 2. In this case, it has been found that flank angles β of not equal to 90° are preferred.

If the side surfaces 40 form an angle of not equal to 90° with the main extension direction R, then the electromagnetic radiation 10 generated is also scattered away from the active zone 14 to the side. Furthermore, the gradients of the gain profile can be set by the choice of angle. The radiation can be directed toward a current barrier 5, for example, where it is absorbed. By way of example, the current barrier 5 is formed by a V-shaped trench filled with an absorber material such as germanium.

Flank angles β of between 15° and 75° prove to be preferred. In the case of excessively small angles, the length of the delimiting structures becomes too large and the gain profile produced becomes too homogeneous.

In the case of excessively large flank angles, on the other hand, that is to say in the case of flank angles β with greater than 75°, the scattering effect decreases toward the side, that is to say away from the contact strip 2.

In order to avoid ring resonances between the delimiting structures or between the delimiting structures 4 and, for example, the coupling-out facet 3 of the semiconductor laser chip 1, the flank angle β is preferably not equal to 45°.

As an alternative to such a choice of flank angle, the delimiting structures 4 can also be arranged in a stepped fashion. This is illustrated in FIG. 17, for example.

Figure 12A:
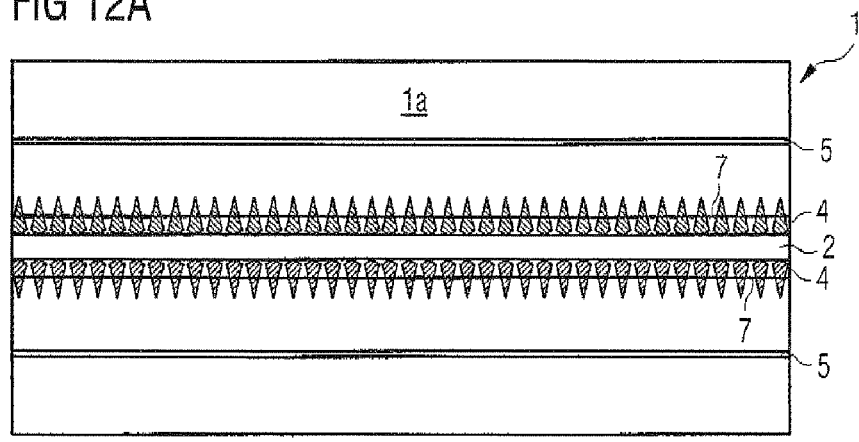
Figure 12B:
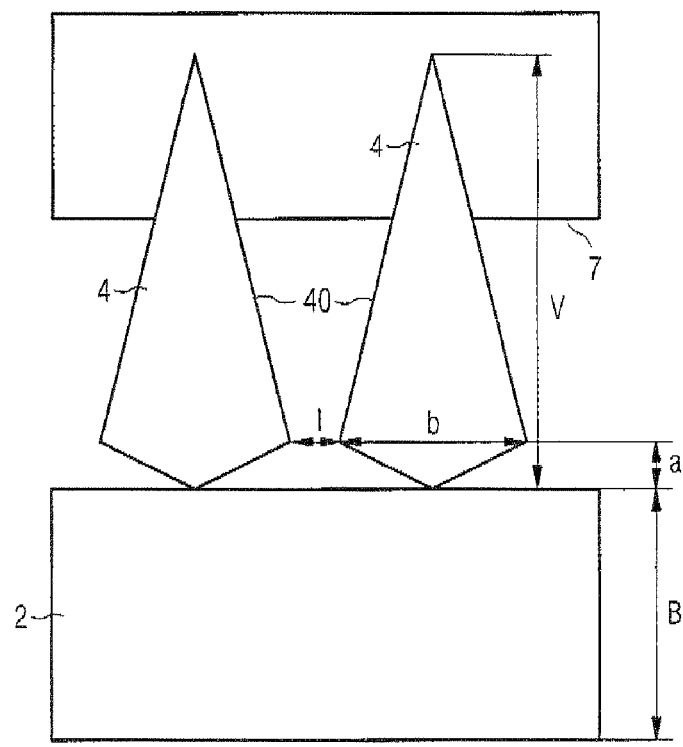

A further exemplary embodiment of an edge emitting semiconductor laser chip described here is explained in greater detail in conjunction with FIGS. 12a and 12b. In this exemplary embodiment, the delimiting structures have the form of stylized Christmas trees. That is to say that the delimiting structures have four corners. In this case, the side surfaces 40 of the delimiting structures have a shallower angle at that end of the delimiting structure 4 which faces the contact strip 2 than at that end of the delimiting structure which is remote from the contact strip 2.

The distance d between the delimiting structures 4 is 10 μm, for example. The distance a is 10 μm. The width V of the delimiting strip is 80 μm. The maximum width b of the delimiting structures 4 is 40 μm. The delimiting structures 4 are filled with germanium starting from the filling line 7. The width B of the contact strip 2 is 70 μm.

Figure 13A:
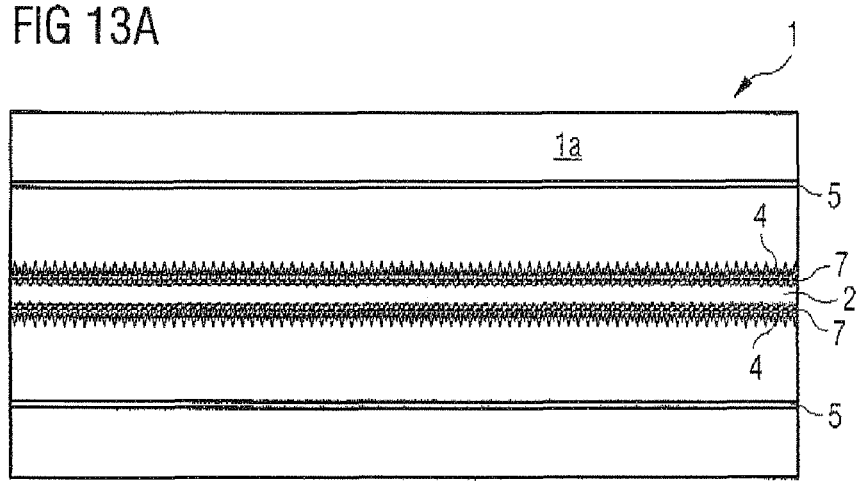
Figure 13B:
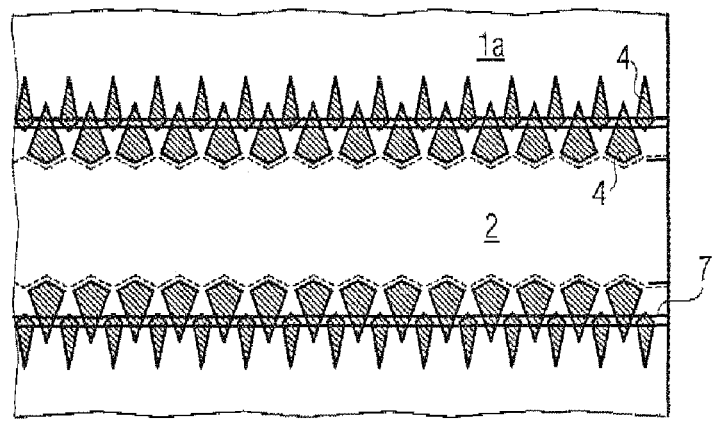

In the exemplary embodiment described in conjunction with FIGS. 13a and 13b of the edge emitting semiconductor laser chip described herein, the delimiting structures are alternately formed by Christmas tree-like structures that differ in terms of their size. In this case, the delimiting structures are arranged symmetrically with respect to the contact strip 2 on both sides thereof. The contact strip 2 itself has, at its side surfaces facing the delimiting structures 4, an undulatory structuring that further improves the desired current impression into the active zone.

Figure 14:
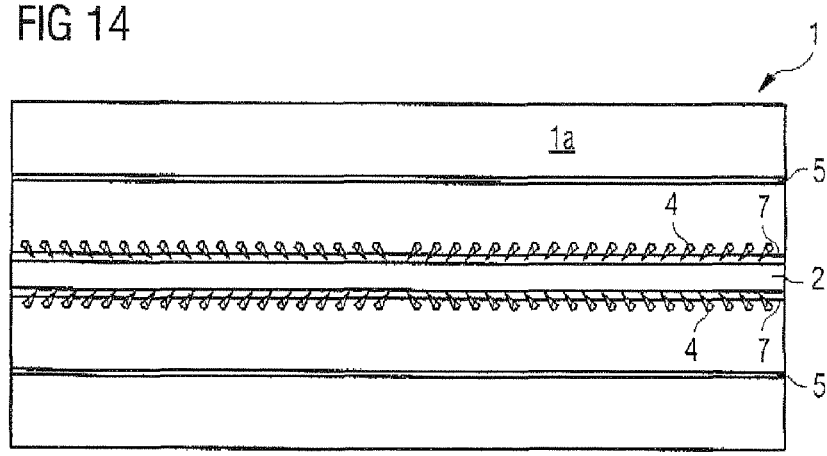

The plan view in FIG. 14 schematically illustrates a further exemplary embodiment of an edge emitting semiconductor laser chip described herein, in which the delimiting structures 4 are formed by wedge-shaped structures oriented in such a way that all the side surfaces 40 of the delimiting structures 4 form lateral flank angles β not equal to 0° and lateral flank angles β not equal to 90° with the main extension direction R of the contact strip. In this case, the orientation of the delimiting structures 4 changes at the center of the contact strip 2. This allows the delimiting structures 4 to appear symmetrical for the wave of electromagnetic radiation 10 circulating in the resonator.

Figure 15:
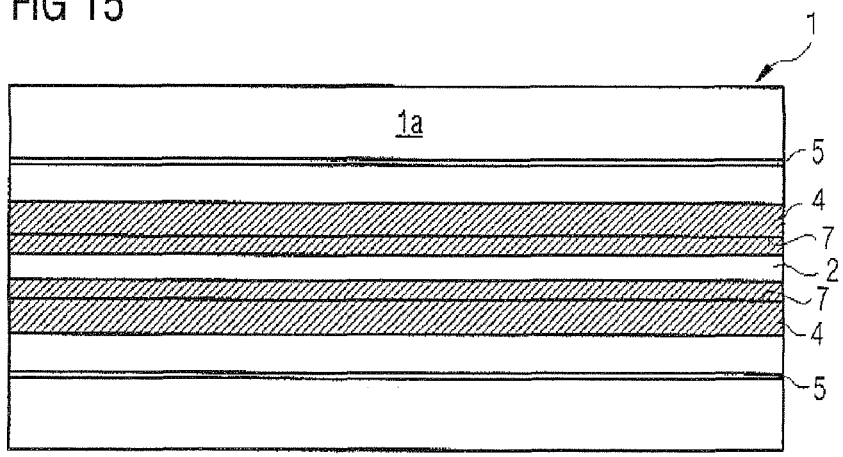

In conjunction with FIG. 15, an exemplary embodiment is explained in which the delimiting structure 4 has a roughening 42 at the bottom surface of a delimiting structure 4. The roughening is a statistical roughening, as explained for example in FIG. 18d on the basis of a schematic sectional illustration. In this case, the roughening can extend through the cladding layer 12 right into the waveguide layer 13 at least in places. The roughening can be produced by dry-chemical or wet-chemical etching, for example. Typical structure sizes of the roughening are 50 nm to 5 μm, for example between 300 nm and 600 nm.

A further exemplary embodiment of an edge emitting semiconductor laser chip 1 described herein is explained in greater detail on the basis of a schematic plan view in conjunction with FIG. 16. In contrast, for example, to the exemplary embodiment shown in FIG. 8, the delimiting structure comprises a roughening. In this case, the delimiting structure 4 can be formed by a cutout, for example, the bottom of which is roughened, as is shown in conjunction with FIG. 18d.

Examples of the configuration of a delimiting structure 4 are explained in greater detail in the schematic sectional illustrations in FIGS. 18a to 18f. In this case, the delimiting structures 4 shown can be used in each of the shown exemplary embodiments of the edge emitting semiconductor laser chip.

Figure 18A:
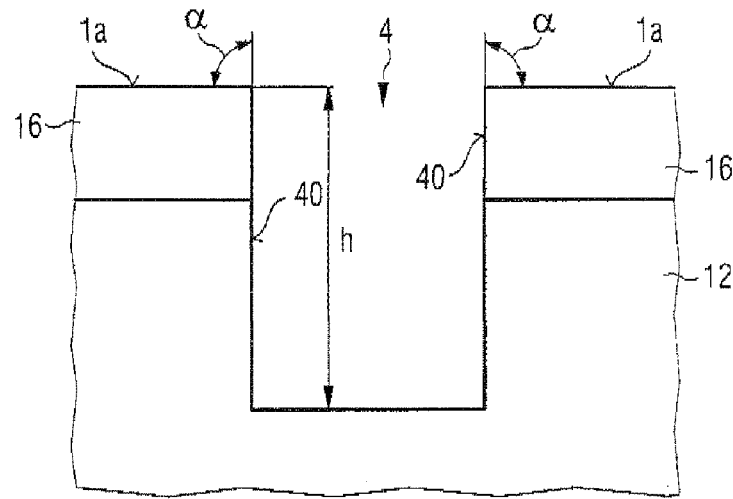
FIGS. 18a to 18f show exemplary embodiments of delimiting structures of edge emitting semiconductor laser chips described herein.

In the exemplary embodiment of a delimiting structure 4 as shown in conjunction with FIG. 18a, the delimiting structure 4 is structured as a cutout into the semiconductor body 100. By way of example, the cutout is etched into the semiconductor body 100. In this case, the side surfaces 40 of the delimiting structure 4 have a vertical flank angle α with the top surface 1a. In the exemplary embodiment in FIG. 18a, the vertical flank angle α=90°. Such a flank angle can be chosen, for example, if the cutout does not extend as far as the waveguide, but rather for example only shortly below the contact layer 16 right into the cladding layer 12.

Figure 18B:
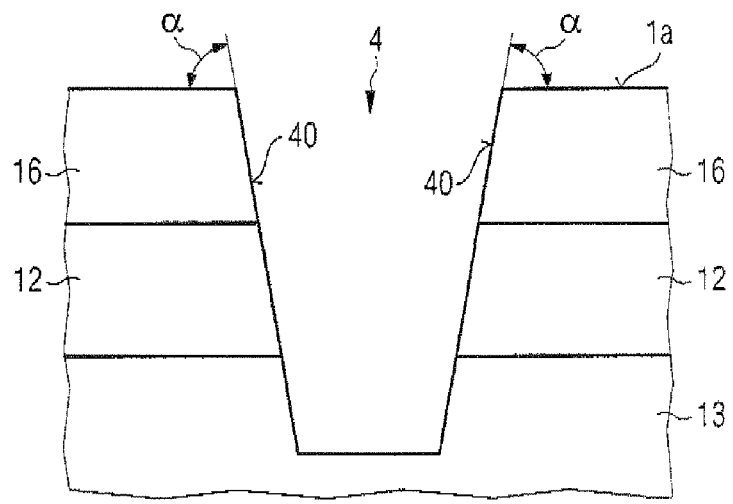

In conjunction with FIG. 18b, by contrast, an exemplary embodiment is shown in which the delimiting structure is formed by a cutout that extends right into the waveguide layer 13. In the case of such a large penetration depth h of the cutout into the semiconductor body 100, the wave of the electromagnetic radiation 10 that circulates in the semiconductor laser chip 1 is scattered at the delimiting structure 4. Steep flanks, that is to say vertical flank angles α in the region of 90°, should be avoided in this case since otherwise the wave is backscattered almost perpendicularly.

Vertical flank angles α of between 20° and 80° are preferred since, in this case, hardly any or no reflection of the wave for example into the contact layer 16 or into the substrate 11 takes place, where the electromagnetic radiation 10 would be absorbed.

Figure 18C:
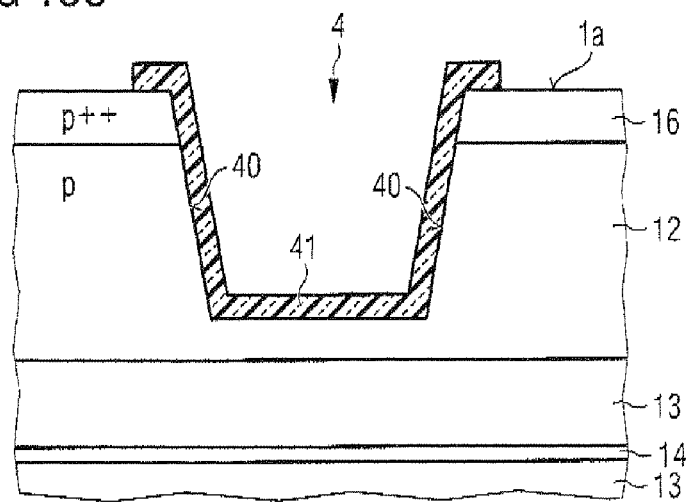

In conjunction with FIG. 18c, an exemplary embodiment of a delimiting structure 4 is shown in which a cutout is filled with a filling material 41. The filling material 41 can be a radiation-absorbing material, for example, by means of which, alongside the gain profile in the active zone, an optical loss profile is also produced on both sides of the contact strip 2. Furthermore, the filling material can be a material having a higher refractive index than the surrounding material of the semiconductor body 100. As a result, the profile of the modes that start to oscillate in the semiconductor laser is deformed by antiguiding and pulled further into the outer region, away from the contact strip 2, where the modes are then influenced to a greater extent by the gain profile. In this case, the antiguiding mechanism has a greater effect on higher lateral modes than, for example, on the lateral fundamental mode. The filling material 41 preferably covers the side surfaces 40 and the bottom surface of the cutout completely.

The effect of absorbing and of antiguiding can also be combined through the choice of a suitable material. In this case, by way of example, amorphous germanium, which has a high refractive index and a high optical absorption, is particularly well suited as filling material. Furthermore, a metal can also be used as filling material 41. Moreover, it is possible for a semiconductor material having a smaller band gap and higher refractive index than the semiconductor body 100 to be used as filling material. This semiconductor material can then be introduced into the cutout epitaxially, for example.

Figure 18D:
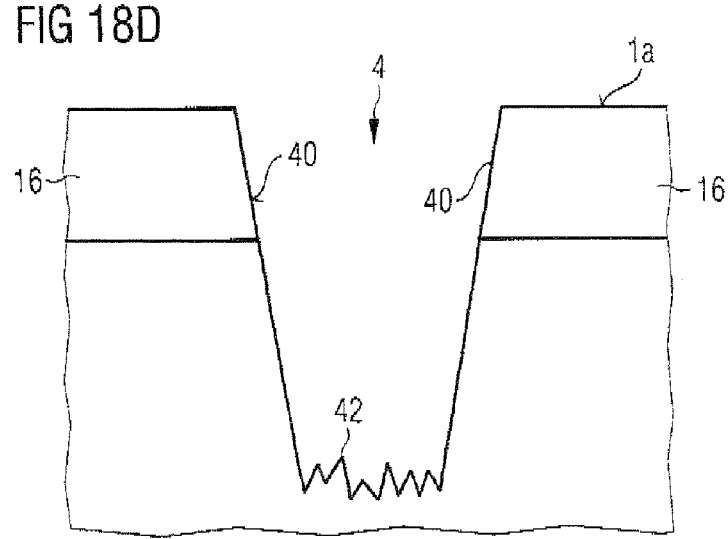

FIG. 18d schematically shows that a delimiting structure 4 can also comprise a roughening 42. The roughening gives rise, in addition to the gain and loss profiles produced by the delimiting structure, to a local scattering in the roughening 42, thereby further suppressing higher lateral modes and preventing ring resonances on account of the statistical scattering at the roughenings 42.

Figure 18E:
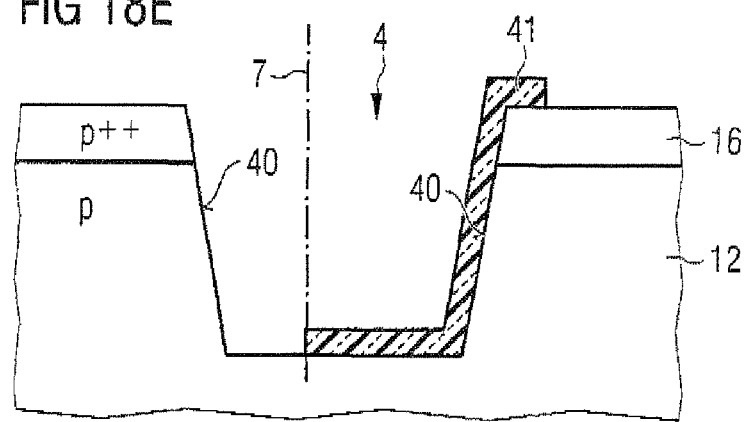

In conjunction with FIG. 18e, on the basis of a schematic sectional illustration, a delimiting structure 4 is explained which is filled with a filling material 41 only partly, starting from the filling line 7. In this case, by way of example, at least the side surface 40 facing the contact strip 2 remains free of the filling material 41.

Figure 18F:
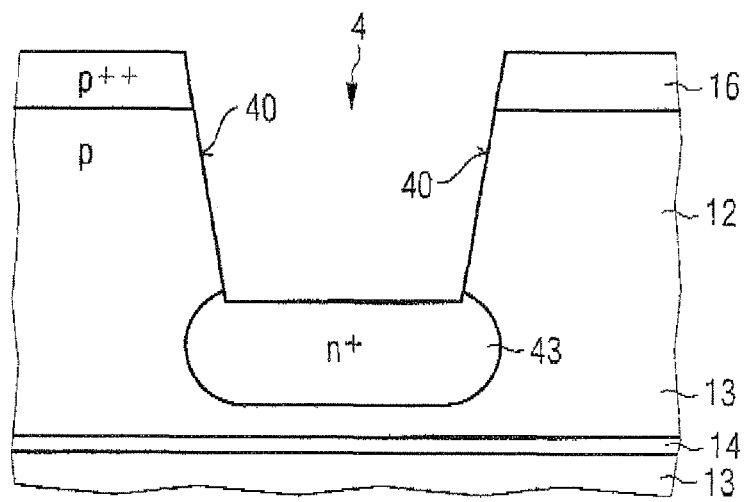

In conjunction with FIG. 18f, on the basis of a schematic sectional illustration, a delimiting structure 4 is explained in which germanium, for example, is introduced as dopant into the diffusion region 43 at the bottom surface of the cutout. A highly n-doped region is formed by means of the doping in the semiconductor body 100, which region can intensify the absorption of the incident electromagnetic wave. In this case, it is also possible for the semiconductor body 100 to be doped in the entire region of the cutout—that is to say at the bottom surface and side surfaces of the cutout.

The invention is not restricted to the exemplary embodiments by the description on the basis thereof. Rather, the invention encompasses any novel feature and also any combination of features, which in particular contains any combination of features in the patent claims, even if this feature or this combination itself is not explicitly specified in the patent claims or exemplary embodiments.

The invention claimed is:

1. An edge emitting semiconductor laser chip comprising:
a semiconductor body that comprises at least one active zone in which electromagnetic radiation is generated during operation of the semiconductor laser chip;
at least one contact strip arranged on a top surface at a top side of the semiconductor body; and
at least two delimiting structures for delimiting current spreading between the contact strip and the active zone, wherein the delimiting structures are arranged on both sides of the contact strip, wherein the delimiting structures are arranged with a filling factor of at least 10% and at most 90% on both sides of the contact strip, wherein at least one delimiting structure comprises a cutout in the semiconductor body, wherein the cutout comprises a filling line in a direction parallel to the contact strip, wherein the cutout is free of a filling material on a side close to the contact strip, and wherein the cutout is filled with the filling material on a side away from the contact strip.

2. The edge emitting semiconductor laser chip according to claim 1, wherein at least one delimiting structure has a side surface adjoining the semiconductor body, wherein the side surface forms an angle of between at least 20° and at most 80° with the top surface of the semiconductor body.

3. The edge emitting semiconductor laser chip according to claim 2, wherein the at least one delimiting structure has the side surface adjoining the semiconductor body, wherein the side surface forms an angle of between at least 15° and at most 75° with a main extension direction of the contact strip.

4. The edge emitting semiconductor laser chip according to claim 1, wherein the delimiting structures comprise a multiplicity of delimiting structures arranged in a manner spaced apart from one another in a main extension direction of the contact strip.

5. The edge emitting semiconductor laser chip according to claim 1, wherein the semiconductor body comprises:
a contact layer that adjoins the contact strip;
a cladding layer that adjoins a side of the contact layer that is remote from the contact strip; and
a waveguide layer that adjoins a side of the cladding layer that is remote from the contact layer,
wherein at least one of the delimiting structures extends into the cladding layer and wherein the waveguide layer is free of the delimiting structure.

6. The edge emitting semiconductor laser chip according to claim 1, wherein at least one delimiting structure extends into a waveguide layer of the semiconductor body and wherein the active zone is free of the delimiting structure.

7. The edge emitting semiconductor laser chip according to claim 1, wherein at least one delimiting structure is arranged at a distance of at most 30 μm laterally with respect to the contact strip.

8. The edge emitting semiconductor laser chip according to claim 1, wherein the delimiting structures are arranged in two delimiting strips on both sides of the contact strip, wherein the delimiting strips each have a width of at most 1 mm.

9. The edge emitting semiconductor laser chip according to claim 1, wherein at least one delimiting structure comprises an implantation region in the semiconductor body.

10. The edge emitting semiconductor laser chip according to claim 1, wherein the filling material is different than the semiconductor body.

11. The edge emitting semiconductor laser chip according to claim 1, further comprising current barriers extend along the contact strip on both sides of the contact strip, wherein the contact strip and the delimiting structures are arranged laterally between the current barriers, and wherein the current barriers are trenches extending to the active zone.

12. The edge emitting semiconductor laser chip according to claim 1, further comprising current barriers extend along the contact strip on both sides of the contact strip, wherein the contact strip and the delimiting structures are arranged laterally between the current barriers, and wherein the current barriers are trenches extending to the active zone.

13. The edge emitting semiconductor laser chip according to claim 1, wherein the delimiting structures are arranged in a stepped fashion.

14. An edge emitting semiconductor laser chip comprising:
a semiconductor body that comprises at least one active zone in which electromagnetic radiation is generated during operation of the semiconductor laser chip;
at least one contact strip arranged on a top surface at a top side of the semiconductor body; and
at least two delimiting structures for delimiting current spreading between the contact strip and the active zone, wherein the delimiting structures are arranged on both sides of the contact strip, wherein the delimiting structures are arranged with a filling factor of at least 10% and at most 90% on both sides of the contact strip, wherein the delimiting structures comprise wedge-shaped structures oriented in a way that all side surfaces of the delimiting structures have lateral flank angles not equal to 0° and not equal to 90° with an extension direction of the contact strip, and wherein an orientation of the delimiting structures changes at a center of the contact strip.

15. The edge emitting semiconductor laser chip according to claim 14, further comprising current barriers extend along the contact strip on both sides of the contact strip, wherein the contact strip and the delimiting structures are arranged laterally between the current barriers, and wherein the current barriers are trenches extending to the active zone.

16. An edge emitting semiconductor laser chip comprising:
a semiconductor body that comprises at least one active zone in which electromagnetic radiation is generated during operation of the semiconductor laser chip;
at least one contact strip arranged on a top surface at a top side of the semiconductor body; and
at least two delimiting structures for delimiting current spreading between the contact strip and the active zone, wherein the delimiting structures are arranged on both sides of the contact strip, wherein the delimiting structures are arranged with a filling factor of at least 10% and at most 90% on both sides of the contact strip, wherein a geometrical form of the delimiting structures, in a plan view of the top surface of the semiconductor laser chip, has four corners and four sides, wherein a corner close to the contact strip has a shallower angle than a corner remote from the contact strip.

17. The edge emitting semiconductor laser chip according to claim 16, wherein the delimiting structures are arranged along a straight line which runs parallel to the contact strip, wherein the delimiting structures are arranged symmetrically on both sides of the contact strip, wherein nearest-neighboring delimiting structures differ in size and next-nearest-neighboring delimiting structures have the same size, and wherein the nearest-neighboring delimiting structures and the next-nearest-neighboring delimiting structures have different distances to the contact strip.

18. The edge emitting semiconductor laser chip according to claim 16, wherein sides of the contact strip facing the delimiting structures comprise an undulatory structure.

* * * * *